(12) United States Patent
Shaddock et al.

(10) Patent No.: US 10,642,630 B1
(45) Date of Patent: May 5, 2020

(54) PROCESS OF PROGRAMMING FIELD PROGRAMMABLE GATE ARRAYS USING PARTIAL RECONFIGURATION

(71) Applicant: Liquid Instruments Pty. Ltd., Acton (AU)

(72) Inventors: Daniel Anthony Shaddock, Canverra (AU); Max Andrew Gordon Schwenke, Canberra (AU); Danielle Marie Rawles Wuchenich, Woodside, CA (US); Benjamin Paul Coughlan, Canberra (AU); Timothy Tien-Yue Lam, Canberra (AU); Paul Anthony Altin, Canberra (AU)

(73) Assignee: LIQUID INSTRUMENTS PTY. LTD., Acton, Australian Capital Territory (AU)

( * ) Notice: Subject to any disclaimer, the term of this patent is extended or adjusted under 35 U.S.C. 154(b) by 80 days.

(21) Appl. No.: 16/113,490

(22) Filed: Aug. 27, 2018

(51) Int. Cl.
  *G06F 9/445* (2018.01)
  *G06F 8/60* (2018.01)
  *G06F 8/41* (2018.01)

(52) U.S. Cl.
  CPC ............ *G06F 9/44505* (2013.01); *G06F 8/41* (2013.01); *G06F 8/60* (2013.01)

(58) Field of Classification Search
  None
  See application file for complete search history.

(56) References Cited

U.S. PATENT DOCUMENTS 7,739,092 B1   6/2010  Ballagh et al.
7,823,117 B1   10/2010 Bennett
(Continued)

OTHER PUBLICATIONS

International Searching Authority, "Search Report" in application No. PCT/US19/47251, dated Nov. 7, 2019, 13 pages.
(Continued)

*Primary Examiner* — Jany Richardson
(74) *Attorney, Agent, or Firm* — Hickman Palermo Becker Bingham LLP

(57) ABSTRACT

In an embodiment, a method is disclosed providing an improvement in speed and efficiency of programming field programmable gate array (FPGA) digital electronic integrated circuits (ICs) or other ICs that support partial reconfiguration, a particular FPGA having a plurality of reconfigurable partitions and a plurality of primitive variations configurable in each of the reconfigurable partitions, the method comprising: before writing configuration bitstreams to the particular FPGA, compiling and storing, using digital storage, a plurality of primitive bitstreams for a plurality of different primitive functions that can be written to and implemented on the particular FPGA; receiving input in a graphical user interface to select and connect graphical blocks representing functional logic of an algorithm to implement on the particular FPGA, the graphical blocks relating to reconfigurable logic; automatically determining a subset of the primitive functions comprising particular primitive functions that correspond to the graphical blocks; obtaining, from the digital storage, a subset of the primitive bitstreams that corresponds to the subset of the primitive functions; using one or more partial reconfiguration operations, writing the subset of the primitive bitstreams to the particular FPGA; wherein the method is performed by one or more computing devices.

18 Claims, 6 Drawing Sheets

(56) References Cited

U.S. PATENT DOCUMENTS

| | | | |
|---|---|---|---|
| 8,997,033 B1 * | 3/2015 | Hew | G06F 30/34 |
| | | | 716/116 |
| 9,449,134 B1 * | 9/2016 | Moussalli | G06F 30/34 |
| 9,584,130 B1 * | 2/2017 | Weber | H03K 19/17756 |
| 9,824,173 B1 | 11/2017 | An et al. | |
| 2019/0007050 A1 | 1/2019 | Atsatt et al. | |
| 2019/0049912 A1 * | 2/2019 | Poornachandran | |
| | | | G05B 19/0425 |

OTHER PUBLICATIONS

Current Claims in application No. PCT/US19/47251, dated Nov. 2019, 5 pages.

\* cited by examiner

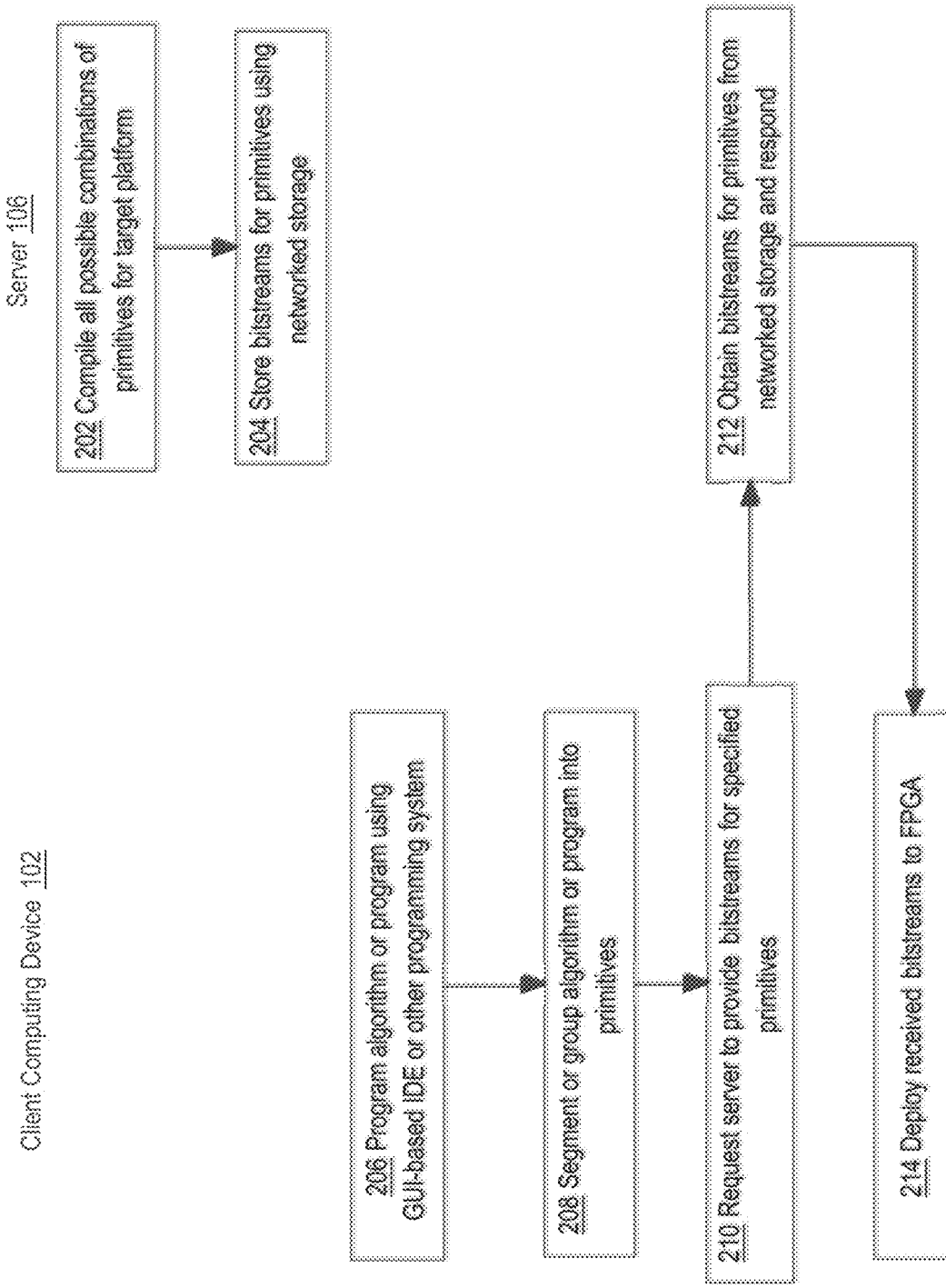

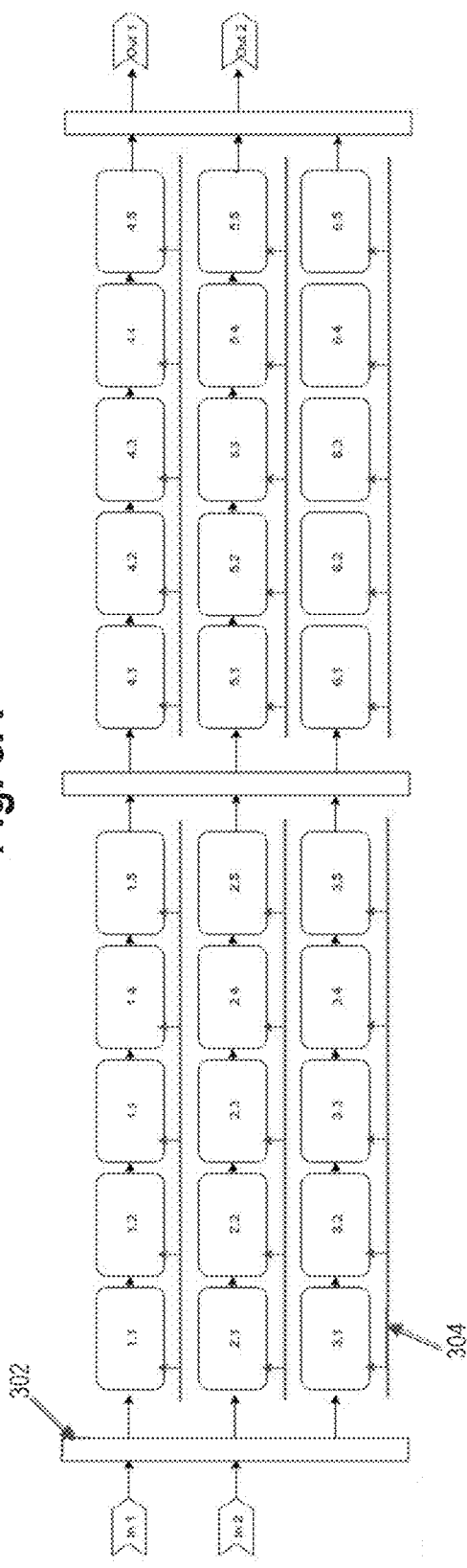

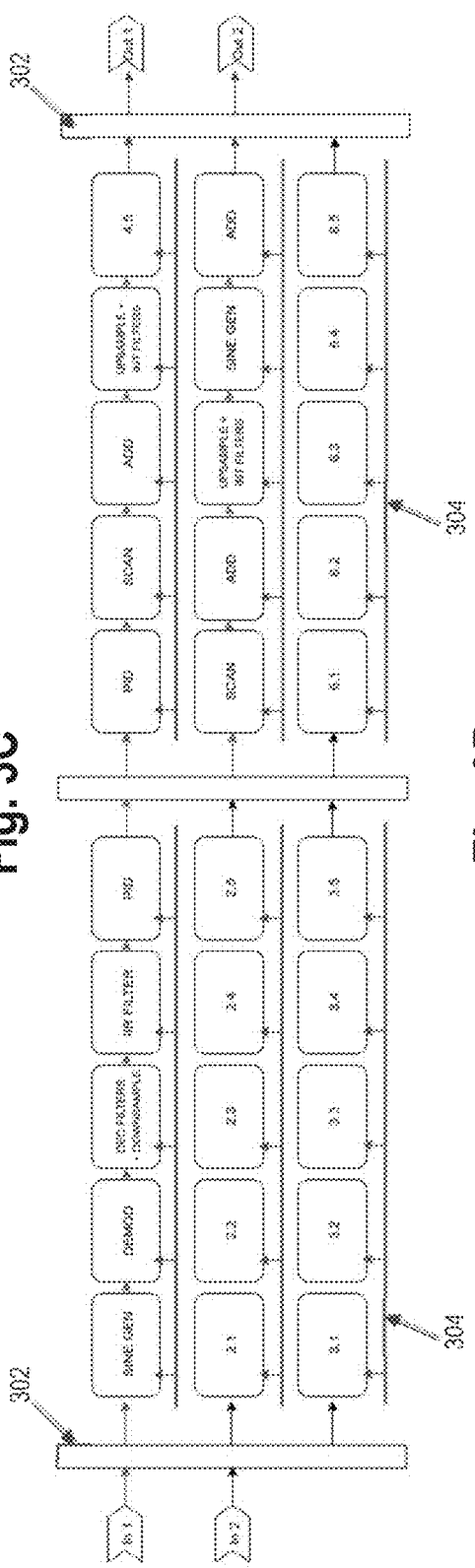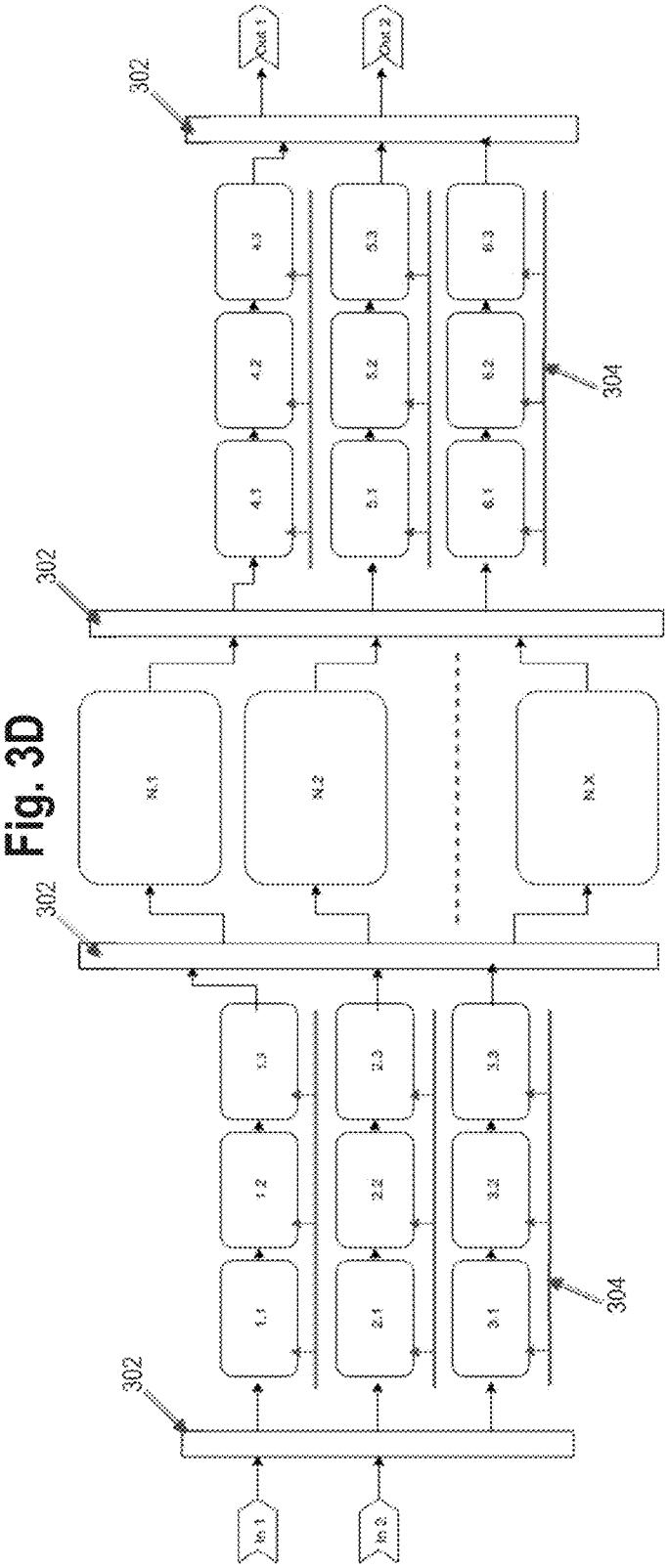

PROCESS OF PROGRAMMING FIELD PROGRAMMABLE GATE ARRAYS USING PARTIAL RECONFIGURATION

FIELD OF THE DISCLOSURE

One technical field of the present disclosure is programming of field programmable gate array (FPGA) integrated circuits (ICs) and other types of programmable ICs. Another technical field is partial reconfiguration (PR) in the field of FPGA programming.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Field programmable gate array (FPGA) integrated circuits are semiconductor devices having a matrix of configurable logic blocks (CLBs) that can be configured to produce different complex digital circuits. The CLBs are connected via programmable interconnects that span the area of the FPGA. FPGAs also may include random-access memory, digital signal processor (DSP) slices, or other logical elements. CLBs can be configured to produce logical operations such as AND and XOR, which are then coupled in series and/or parallel with other logical elements on the FPGA to produce a specified digital circuit.

FPGA configurations are described using a hardware description language (HDL) such as Verilog or VHDL. Programs written in an HDL are compiled using specialized software to generate bitstreams that contain configuration information for a particular target FPGA. VIVADO is an example integrated design environment that can be used to write and compile HDL designs to generate bitstreams for Xilinx FPGAs.

FPGAs have proven extremely powerful for implementing high-speed DSP or highly parallel DSP algorithms. FPGAs are commercially available from Xilinx, Inc., for example. FPGAs have enabled the creation of reconfigurable digital electronic products. One example is Moku:Lab, developed by Liquid Instruments Pty Ltd. However, present techniques for programming FPGAs suffer from several drawbacks.

Programming FPGAs typically requires specialized knowledge that can be time-consuming to learn. Often compilation tools are only available from the maker or vendor of the FPGA and have interfaces that are unique to those chips. Users must invest time in installing these tools as well as learning them. Development times can be long, depending on complexity. Furthermore, the time to compile a completed program, including for design changes or throughout development, can be on the order of several minutes to many hours, depending on complexity. Today's developers, faced with making a relatively simple change to an FPGA program, do not want to wait hours for the entire bitstream to be recompiled and delivered prior to loading into the FPGA.

Based on these issues, improved techniques for FPGA programming are needed and there is a specific long-felt but unfulfilled need for a way to greatly shorten the time to compile FPGA programs.

SUMMARY

The appended claims may serve as a summary of the invention.

BRIEF DESCRIPTION OF THE DRAWINGS

In the drawings:

FIG. 2 illustrates an example computational embodiment according to an embodiment.

FIG. 3A illustrates an example system architecture for an FPGA with partial reconfiguration.

FIG. 3B illustrates an example of a complex DSP algorithm as it might be designed using the GUI of an IDE to select and graphically connect functional blocks representing signal processing circuitry.

FIG. 3C illustrates an example of implementing FIG. 3B within the architecture of FIG. 3A.

FIG. 3D illustrates a variation of the foregoing architecture in which low-level PR modules are a secondary feature.

DETAILED DESCRIPTION

Figure 1:
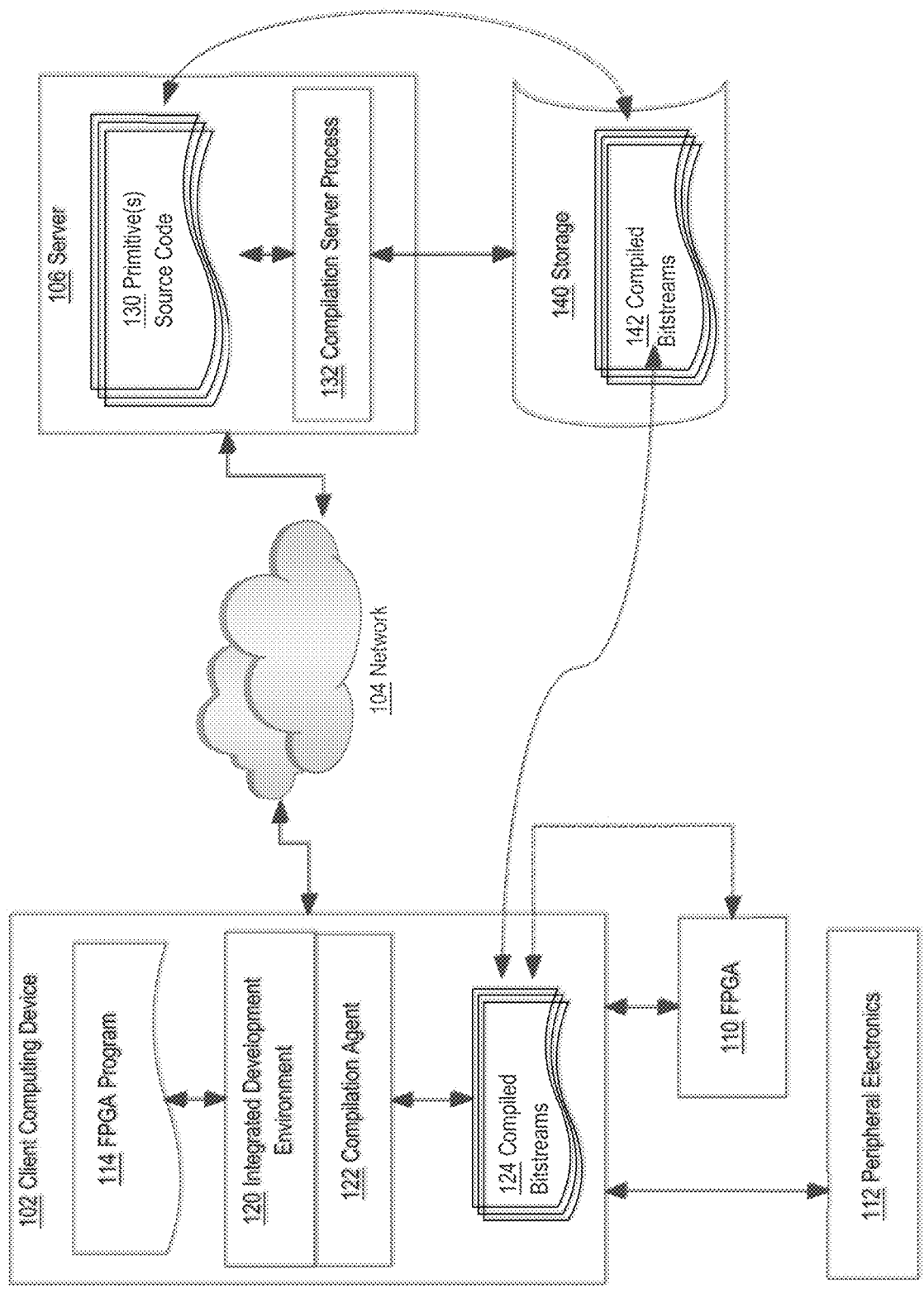
FIG. 1 illustrates an example distributed computer system that may be used to implement an example.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention. Embodiments are described in sections according to the following outline:

1. Foundation Technology
2. General Overview of Embodiments
3. Structural & Functional Examples of Embodiments
4. Implementation Example—Hardware Overview

1. Foundation Technology

DSP algorithms often can be described symbolically using block diagrams. Several commercially available systems permit designing algorithms for digital integrated circuits (ICs), such as FPGAs or others, using a block diagram graphical user interface (GUI). Simulink and LabVIEW are commercial examples of tools that offer block diagram environments capable of facilitating the design, verification and implementation of software-based digital systems, for FPGAs and other target platforms. These systems remove some of the complexity of programming the target platform, but still require long compilation times, and may result in long development times.

GNUradio is an example of a tool that provides an environment to drag and drop individual function blocks together and observe their interactions on a host processor connected to GNUradio compatible hardware. With this system, a designer is not required to generate the source code for deployment to an external processing system. However, GNUradio is not suitable for high-bandwidth hardware-based applications.

With partial reconfiguration (PR), FPGA programmed circuits may be divided into regions, which are compiled individually, producing a region bitstream as the result. Each region bitstream may be loaded into an existing FPGA individually, so that an existing region bitstream is effectively swapped out for a new one. Modern FPGAs can support hundreds of separate regions, each of which is independently configurable.

Partial reconfiguration (PR) is an FPGA configuration technique that allows dynamic changing of functional modules in an active design while the rest of the FPGA continues to operate. PR can be used to change hardware modules at different times during runtime of an FPGA, thereby permitting large or complex designs to fit on a smaller FPGA. An example is a software-defined radio in which different modulation and demodulation protocols are swapped at runtime. PR is available, for example, on the Xilinx ZYNQ family of FPGAs.

With PR, circuit designs are divided into reconfigurable and non-reconfigurable logic. The term static logic is used for all logical elements on an FPGA that are not reconfigurable, while the term reconfigurable logic refers to logic elements that are reconfigurable. A reconfigurable module (RM) (or "module") is the HDL description of logic that can be placed within a reconfigurable partition (RP) (or "partition"). Each RP is a physical collection of logical elements on the FPGA that are dedicated for use only within that partition. A reconfigurable frame (RF) represents the smallest reconfigurable region that can be defined as an RP. Multiple RFs can be included in a single RP and are encapsulated in it. Partial bitstreams are the generated files that contain information about the configuration specifics and configuration location of a RM.

Once a design is separated into static logic and reconfigurable logic, the reconfigurable logic is divided into RP sections and all RMs for each partition are identified. Each bitstream includes configuration data and location data. Therefore, a separate single bitstream is generated for all modules in all RP locations. Thus, if the same functional module is needed in two different RPs, two bitstreams are needed. Modules and partitions are subject to other constraints that are not relevant to this disclosure, but that may affect the implementation of specific circuits; these constraints are well documented in other publications.

2. General Overview of Embodiments

In one embodiment, a method is disclosed providing an improvement in speed and efficiency of configuring a digital electronic integrated circuit (IC) that supports partial reconfiguration, a particular IC having a plurality of reconfigurable partitions and a plurality of primitive variations configurable in each of the reconfigurable partitions, and which when executed using one or more processors cause the one or more processors to perform: before writing configuration bitstreams to the particular IC, compiling and storing, using digital storage, a plurality of primitive bitstreams for a plurality of different primitive functions that can be written to and implemented on the particular IC; receiving input to specify functional logic of an algorithm to implement on the particular IC using reconfigurable logic; automatically determining a subset of the primitive functions comprising particular primitive functions that correspond to the functional logic; obtaining, from the digital storage, a subset of the primitive bitstreams that corresponds to the subset of the primitive functions; using one or more partial reconfiguration operations, writing the subset of the primitive bitstreams to the particular IC; wherein the method is performed by one or more computing devices.

In another embodiment, a method is disclosed providing an improvement in speed and efficiency of programming field programmable gate array (FPGA) digital electronic integrated circuits that support partial reconfiguration, a particular FPGA having a plurality of reconfigurable partitions and a plurality of primitive variations configurable in each of the reconfigurable partitions, the method comprising: before writing configuration bitstreams to the particular FPGA, compiling and storing, using digital storage, a plurality of primitive bitstreams for a plurality of different primitive functions that can be written to and implemented on the particular FPGA; receiving input to specify functional logic of an algorithm to implement on the particular FPGA, using reconfigurable logic in part; automatically determining a subset of the primitive functions comprising particular primitive functions that correspond to the graphical blocks; obtaining, from the digital storage, a subset of the primitive bitstreams that corresponds to the subset of the primitive functions; using one or more partial reconfiguration operations, writing the subset of the primitive bitstreams to the particular FPGA; wherein the method is performed by one or more computing devices.

Embodiments assume that all block diagrams for FPGA algorithms can be described using N discrete block types, connected in a matrix of M block regions. While certain embodiments are described specifically for use with FPGAs, the methods of this disclosure can be applied more generally to other programmable integrated circuits and the use of FPGAs is not required.

One approach might be for bitstreams for all possible block diagram connections to be compiled ahead of time, then selected based on the user's block diagram. The storage and compilation of $N^M$ full bitstreams is involved. As M and/or N increases beyond small values, the amount of storage and compilation time for this approach becomes non-viable. Storage and compilation time increases exponentially or polynomially with increases in M or N. Each partial bitstream is on the order of 100 kB and takes about 5 minutes to compile, depending on complexity. If M=N=100, then about $5*100^{100}$ minutes of compilation time and $100^{98}$ GB of storage is required.

In embodiment, partial reconfiguration (PR) techniques are employed in which each of the M regions is defined as partially reconfigurable and a single partial bitstream for each of N block types is compiled ahead of time for each M region. "Ahead of time," in this context, means before an end user computer is used to design an algorithm using a graphical tool or non-graphical tool; when the design process starts the user has available a pre-compiled library of many bitstreams, corresponding to the available N block types that can be configured to realize an algorithm. Consequently, compilation and storage of only M*N bitstreams is needed. If M=N=100, then only 50,000 minutes of compilation time and 1 GB of storage is required. This approach relies to an extent on prediction of the particular functions that user algorithms or applications will need, and precomputing bitstreams for those functions.

In some embodiment, a single partial bitstream for fewer than all the N block types is compiled ahead of time, and bitstreams for other block types that are needed to fully deploy an algorithm to a target platform are compiled at the time of design and/or just before deployment. In some embodiments, a subset of fewer than N block types is selected for pre-compilation based upon popularity of the block types in past use by the current user or other users, and thus the subset contains the block types that are most likely to be selected in a particular design. For example, compilation agent 122 may be programmed to detect user selection of particular block types in IDE 120 and to transmit reports of user selections to the compilation server process 132, for storage alone or in combination with data received in a similar manner from other instances of the compilation agent that are running on different host computers of unrelated users. In this manner, crowd-sourced reports of actual selections of block types may influence which block types are pre-compiled on the server side. Or, user input and/or configuration data can specify which block types are pre-compiled and which block types are compiled at design or deployment time. This approach may permit users to balance the time-saving and efficiency benefits of having a stored library of pre-compiled bitstreams against the computational burden of undertaking compilation in advance. Other embodiments, aspects and features will become apparent from the disclosure as a whole and the appended claims.

3. Structural & Functional Examples of Embodiments

FIG. 1 illustrates an example distributed computer system that may be used to implement an example. In the discussion of the drawing figures, the term "primitive" refers to the grouping of logic for a DSP or other application of FPGA 110 that is compiled into a single partial bitstream.

In an embodiment, a client computing device 102 is communicatively coupled directly or indirectly via one or more networks 104 to a server 106.

Client computing device 102 may comprise a desktop computer, laptop computer, mobile computing device, workstation or other computing device that is capable of interfacing to an FPGA 110, which will be programmed to implement the user's algorithm. In an embodiment, client computing device 102 also interfaces to peripheral electronics 112, which may include one or more of processor development boards, analog-to-digital converters, digital-to-analog converters, network connections, power converters or others, in various embodiments.

The client computing device 102 hosts or executes an integrated development environment (IDE) 120, which is an application program arranged to support creation, management and compilation of an FPGA program 114. In some embodiments, IDE 120 generates and allows user interaction with a graphical user interface that permits programming DSP algorithms by connecting graphical blocks, icons or widgets that represent computational functions.

In an embodiment, a compilation agent 122 is hosted or executed using the client computing device 102, integrated with the IDE 120 or as a separate program, and is programmed or configured to interoperate with a compatible compilation server process 132 at the server 106 as further described. In an embodiment, compilation agent 122 is programmed to determine which bitstream primitives to acquire from the server 106 and where to place them within the FPGA 110. Using these elements, client computing device 102 may generate or obtain a set of compiled bitstreams 124 that are written to FPGA 110 to accomplish programming the FPGA. In some embodiments, IDE 120 and compilation agent 122 are configured or programmed to execute communications or messaging protocols between the server 106 and networked data storage 140 that contain or control distribution of compiled bitstream primitives 142, as further described in other sections; running software and firmware to control client tasks; and storing the compiled bitstreams 124 for primitives to be programmed in FPGA 110. Depending on the number of primitives and/or storage requirements, storage of compiled bitstreams 124 may be shared or fully executed by the server 106 using storage 140.

FPGA 110 supports PR. In an embodiment, FPGA 110 is a very large unit having a plurality of regions each containing a number of processing elements sufficient for the most resource-intensive configuration that a programmed algorithm could require. A large resource count that is spread over many discrete regions is anticipated. While one embodiment may execute best in larger FPGAs in which the user is less concerned with space, the method described herein are usable regardless of device size and a large FPGA or other large platform is not a requirement.

Network 104 broadly represents any combination of local area networks, wide-area networks, internetworks or internets using any of terrestrial, satellite, wired or wireless links. Client computing device 102 and server 106 each host interfaces to network 104 that are compatible with protocols for transport, session and application traffic carried over network 104. The specific protocols used over network 104 are not critical provided that client computing device 102 and server 106 can communicate using digital electronic messages and asynchronous, stateless or stateful protocols to exchange requests, responses and data payloads.

In an embodiment, server 106 comprises any of a desktop computer, rack-mounted computer, or one or more virtual computing instances in a public or private cloud computing center. Server 106 may comprise a process executing on a server computer or cluster with other processes, servers or applications. Server 106 may be implemented using operating system virtualization such as using DOCKER or KUBERNETES containerization. Server 106 includes, or is programmed to access, storage 140 which may comprise cloud-based digital data storage or other networked data storage.

In an embodiment, server 106 stores source code 130 for FPGA primitive functions, which are further described in other sections herein. Server 106 also hosts or executes a compilation server process 132 which is configured or programmed to compile source code 130 into bitstream primitives that are stored in storage 140 as indicated by compiled bitstreams 142. Significantly, in embodiments, source code 130 for all function primitives that could be used in reconfigurable partitions of FPGA 110 are compiled in advance of any programming activity by the client computing device 102 and stored in storage 140 to await requests for the bitstreams from the client computing device. The compilation server process 132 may use programs, libraries or functions that are obtained in advance from a vendor of FPGA 110 or are otherwise compatible with the FPGA 110.

Bitstreams 142 of primitives may implement any of a large number of different substantive signal processing functions. Examples of primitives that can be used in various embodiments include: signal adder; signal multiplier; signal mixer; digital filter; oscillator; integrator; trigonometric operations; fast-Fourier transform; PID controller; phase-locked loop; integrator; differentiator; sine wave generator; direct digital synthesizer; direct-form one single-order section infinite impulse response filter; DC gain.

In the example of FIG. 1, server 106 is programmed or configured for storing compiled bitstreams 142 of primitives using storage 140. Depending on the number of primitives and/or storage requirements, this task may be shared fully executed by the client computing device 102. The compilation server process 132 also is programmed or configured for fetching and transmitting compiled bitstreams 142 to the client computing device 102, in response to requests from the client computing device 102, as further described.

One embodiment has been described in which certain operations occur in client computing device 102, in communication over network 104 with server 106, and in which storage 140 is managed in association with the server. However, other embodiments may be fully implemented in a single host computer or virtual computing instance and there is no requirement for a client-server architecture. Furthermore, storage 140 may be located at the host computer or may be associated with a virtual computing instance and there is no requirement for digital storage of pre-compiled bitstreams to be separated from the client computing device 102 or any other computer that is used to design algorithms. For example, a single host computer or virtual computing instances, such as client computing device 102, may host all functional elements and data storage devices shown in FIG. 1 as an integrated system. Or, the architecture of FIG. 1 may be used but a set of pre-compiled bitstreams may be delivered from server 106 to client computing device 102 as a package or unit for local storage at the client computing device. In one embodiment, delivery of a package of pre-compiled bitstreams is performed using an installer process that is executed using any combination of client software at the client computing device and/or browser-executable code that runs in a browser at the client computing device.

FIG. 2 illustrates an example computer-implemented process according to an embodiment. The example of FIG. 2 involves functional steps that are executed by client computing device 102 and server 106 at different times.

In an embodiment, at block 202, a server or server computer pre-compiles all possible combinations of primitives for a specified target platform. At block 204, the process stores the compiled bitstream primitives on network storage.

For example, server 106 pre-compiles source code 130 of primitives using compilation server process into compiled bitstreams 142 that are stored using storage 140. The number of primitives represented in source code 130 may vary in different embodiments. For example, a specified FPGA may be defined in configuration data as supporting "100" partitions. For each of the partitions, N different variations are available to receive bitstreams that are pre-compiled. The sets of bitstreams for a particular region are not necessarily interchangeable with those for any other regions. Thus, region "01" of the FPGA may support a first bitstream selected from among first particular set of 20 different bitstreams, and region "64" of the same FPGA may support a second bitstream that is selected from among a second different, particular set of 20 other bitstreams.

In an embodiment, administrative action or configuration data may specify a change to the variations that are associated with partitions of the target FPGA. For example, if partition "64" is modified to add a phase-locked loop functional block to a variation in that partition, which did not previously have a PLL block associated with it or in one of its variations, then all bitstreams of partition "64" would need to be recompiled using server 106. However, each functional block that is associated with a partition can contain several sets of unrelated logic instructions, increasing flexibility. For example, a particular variation among the 20 variations associated with partition "64" could define logic both for a PLL and for an adder. In some embodiments, any two or more sets of logic may be in a functional block that is associated with a variation of a partition. This arrangement may be constrained by the total computational power available in the FPGA.

Asynchronously, at block 206, at a client computing device an algorithm or program is defined or programmed using a graphical user interface. For example, a DSP algorithm could be defined. Defining the DSP algorithm may comprise receiving user input that specifies dragging, dropping and connecting graphical blocks that symbolically define operations of a DSP algorithm in a GUI interface of the IDE 120.

In some embodiments, block 206 may include receiving one or more parameter values to alter configuration of a particular functional block. Examples include register-level parameter values or specifying redirection of inputs or outputs to specified registers or other output locations.

At block 208, using the client computing device 102, the algorithm is segmented or grouped into corresponding primitives. Block 208 may involve determining which available RPs and variations of the FPGA 110 are to receive which specific pre-compiled primitive bitstreams 142 to result in implementing the algorithm on the FPGA.

Block 208 may also involve determining associations of functional blocks of the algorithm, as specified in the GUI using IDE 120, to available primitives that have been pre-compiled at the server. In some embodiments, block 208 may be performed automatically based upon a mapping table, configuration file or other data that specifies how a functional block represented in the GUI corresponds to a particular primitive and/or bitstream at server 106. Alternatively, the IDE 120 may provide GUI widgets, natively or under control of compilation agent 122, that are programmed to accept input to select a functional block in the GUI and specify a particular primitive for implementing that block.

At this point, the client computing device 102 has determined identifiers for all pre-compiled bitstreams 142 that are needed to implement the algorithm on the FPGA, and that can be swapped into RPs and variations of RPs on the FPGA.

At block 210, the client computing device 102 transmits a request to the server 106 to obtain bitstreams for specified primitives. One or more requests may be transmitted. The one or more requests collectively specify all the pre-compiled bitstreams 142 that are needed to implement the algorithm on the FPGA, and that can be swapped into RPs and variations of RPs on the FPGA.

At block 212, at the server 106, bitstream primitives corresponding to the DSP algorithm's regions and groups are fetched from storage 140 or other networked storage and copies are returned to the client computing device 102 in a response over network 104. The compiled bitstreams 142 may be stored at client computing device 102 in the form of compiled bitstreams 124 after they are received.

At block 214, the fetched bitstreams are deployed to the FPGA. Compilation agent 122, in coordination with IDE 120, may cause writing the received compiled bitstreams 124 to specified FPs and variations of the FPGA 110. Upon completion of block 214, the FPGA has been programmed with all reconfigurable logic that was designed using the GUI of IDE 120 and implemented using precompiled bitstreams 142 of primitives associated with the design. These steps occur substantially faster than conventional approaches in which compilation of bitstreams would be required at this point to deploy an algorithm to an IC.

FIG. 3A illustrates an example system architecture for an FPGA with partial reconfiguration. In an embodiment, two inputs "in 1", "in 2" are coupled indirectly to two sets of three (3) rows each having five (5) sequentially connected DSP block PR regions, denoted "1.1" to "6.5". A plurality of interconnects 302 allow arbitrary connections between rows. Interconnects 302 may be implemented in different ways in different embodiments. Examples include a large multiplexing network, high-speed AXI data buses, or as PR regions with variations for different connections.

Each DSP PR region 1.1 to 6.5 is identical and can be configured as one of N variants, each of which is described using a different bitstream primitive from among the pre-compiled bitstreams 142. The interface for each variant is the same, including the inputs "in 1", "in 2" and outputs "Out 1", "Out 2" and a connection to the configuration AXI bus 304. Each variation contains logic for a different purpose, as well as output multiplexing to select which signals are passed to each output.

While certain embodiments have mentioned the use of up to 20 variations and about 20 functional blocks of logic, other embodiments may use other counts of these elements and in particular there is no limit on the number of different kinds of logic that can be defined for use in a particular variation. Examples of possible functional blocks that can be used in various embodiments of PR region configurations include: signal adder; signal multiplier; signal mixer; digital filter; oscillator; integrator; trigonometric operations; fast-Fourier transform; PID controller; phase-locked loop; integrator; differentiator; sine wave generator; direct digital synthesizer; direct-form one single-order section infinite impulse response filter; DC gain; null. Furthermore, complex functional blocks may result in bitstreams that are divided across two or more variations of an FPGA region.

FIG. 3B illustrates an example of a complex DSP algorithm as it might be designed using the GUI of an IDE to select and graphically connect functional blocks representing signal processing circuitry. The example of FIG. 3B comprises a block diagram for a frequency modulation control system and it will be seen that signal processing functions may include sine wave generators (Sine Gen), demodulation, controllers, a scanner and an IIR. Blocks 310, 312 that are grouped inside broken lines are examples of elements that can be grouped into single bitstream primitives.

FIG. 3C illustrates an example of implementing FIG. 3B within the architecture of FIG. 3A. In FIG. 3C, the functional blocks of FIG. 3B have been assigned to specific RPs or regions of the architecture of FIG. 3A, and labeled appropriately in FIG. 3C to indicate these associations. For example, region 1.1 of FIG. 3A is assigned to Sine Gen logic, 1.2 is the demodulator, and so forth. The selection of regions in relation to interconnects 302 and buses 304 accomplishes an implementation of the logic of FIG. 3B in a particular chip arrangement.

FIG. 3D illustrates a variation of the foregoing architecture in which low-level PR modules are a secondary feature. In this example, boxes N.1, N.2, N.X represent larger PR regions that can be configured as single-channel versions of existing instruments, for example, instruments available on Moku:Lab. With this arrangement, users can create highly complex systems using a single hardware unit. The low-level PR modules 1.1, 1.2, 1.3 to 6.3 remain useful for further customization to meet specific use cases or user requirements. Thus, this architecture illustrates the possibility of integrating an FPGA having larger PR regions that are dedicated to complex functions with low-level modules that can be reconfigured using the pre-compiled bitstreams 142 to swap in other functionality on the chip, without disrupting use of the larger PR regions and the main functions of the chip.

Figure 4:
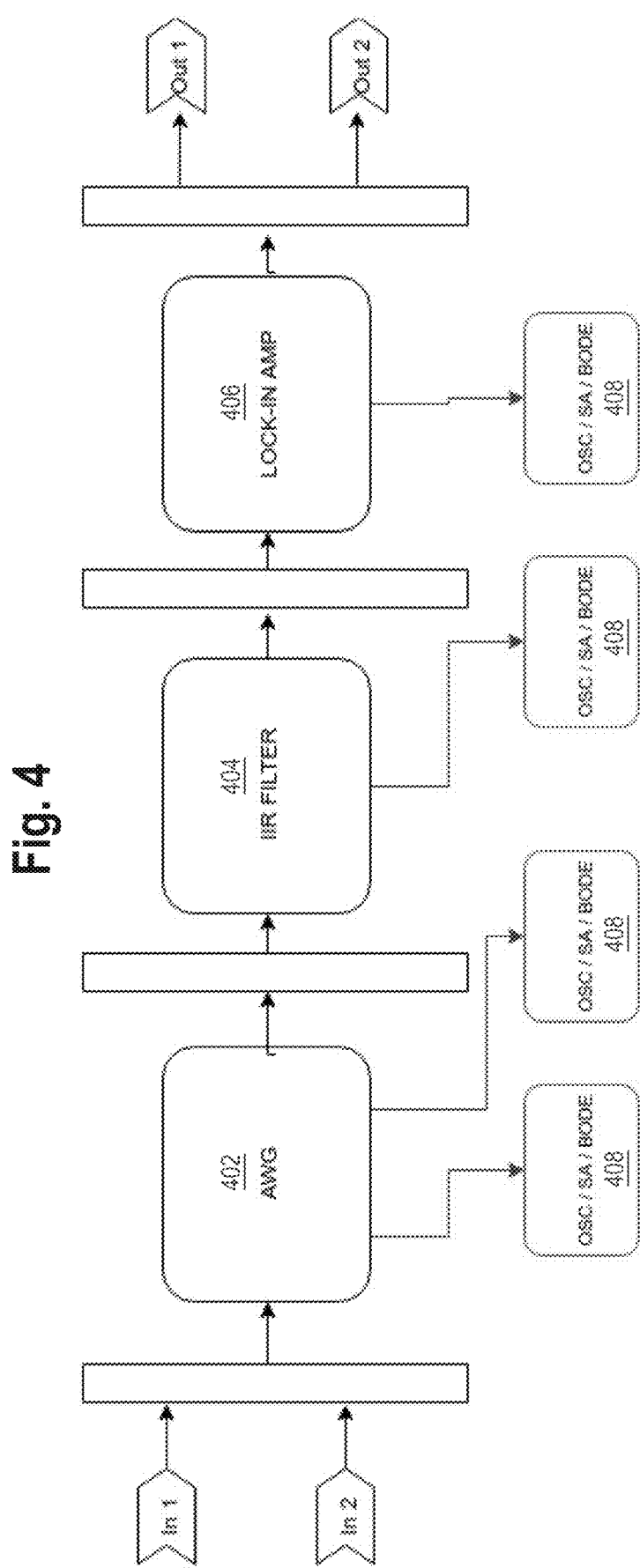
FIG. 4 illustrates another architecture variation in which instruments are split into two categories: measurement or monitoring instruments and signal generation or controller instruments.

FIG. 4 illustrates another architecture variation in which instruments are split into two categories: measurement or monitoring instruments and signal generation or controller instruments. PR regions 402, 404, 406 are specific to the signal generation or controller instruments and PR regions 408 are specific to measurement or monitoring instruments. Using this arrangement, the same functionality of Moku:Lab system is maintained and with greater flexibility. Furthermore, if two (2) variations are allocated for signal generation or controller instruments, then the resources required in an FPGA would not be significantly higher than the Moku:Lab device available at this writing.

Embodiments offer numerous benefits over prior practice. A key benefit is that from the user's perspective, compile time is completely eliminated. The client computing device 102 can obtain pre-compiled versions of bitstreams for each functional block that is needed to program an FPGA without the long delays involved in local compilation of FPGA blocks. Furthermore, all the tools needed to accomplish compilation are pre-installed and managed on the server computer 106 and provided as a service to the client computing device 102. Therefore, users of client computing devices 102 are not required to install or learn chip-specific or vendor-specific compilation tools.

4. Implementation Example—Hardware Overview

According to one embodiment, the techniques described herein are implemented by at least one computing device. The techniques may be implemented in whole or in part using a combination of at least one server computer and/or other computing devices that are coupled using a network, such as a packet data network. The computing devices may include at least one general purpose hardware processor programmed to perform the techniques pursuant to program instructions in firmware, memory, other storage, or a combination. Such computing devices may also combine custom hard-wired logic, ASICs, or FPGAs with custom programming to accomplish the described techniques. The computing devices may be server computers, workstations, personal computers, portable computer systems, handheld devices, mobile computing devices, wearable devices, body mounted or implantable devices, smartphones, smart appliances, internetworking devices, autonomous or semi-autonomous devices such as robots or unmanned ground or aerial vehicles, any other electronic device that incorporates hard-wired and/or program logic to implement the described techniques, one or more virtual computing machines or instances in a data center, and/or a network of server computers and/or personal computers.

Figure 5:
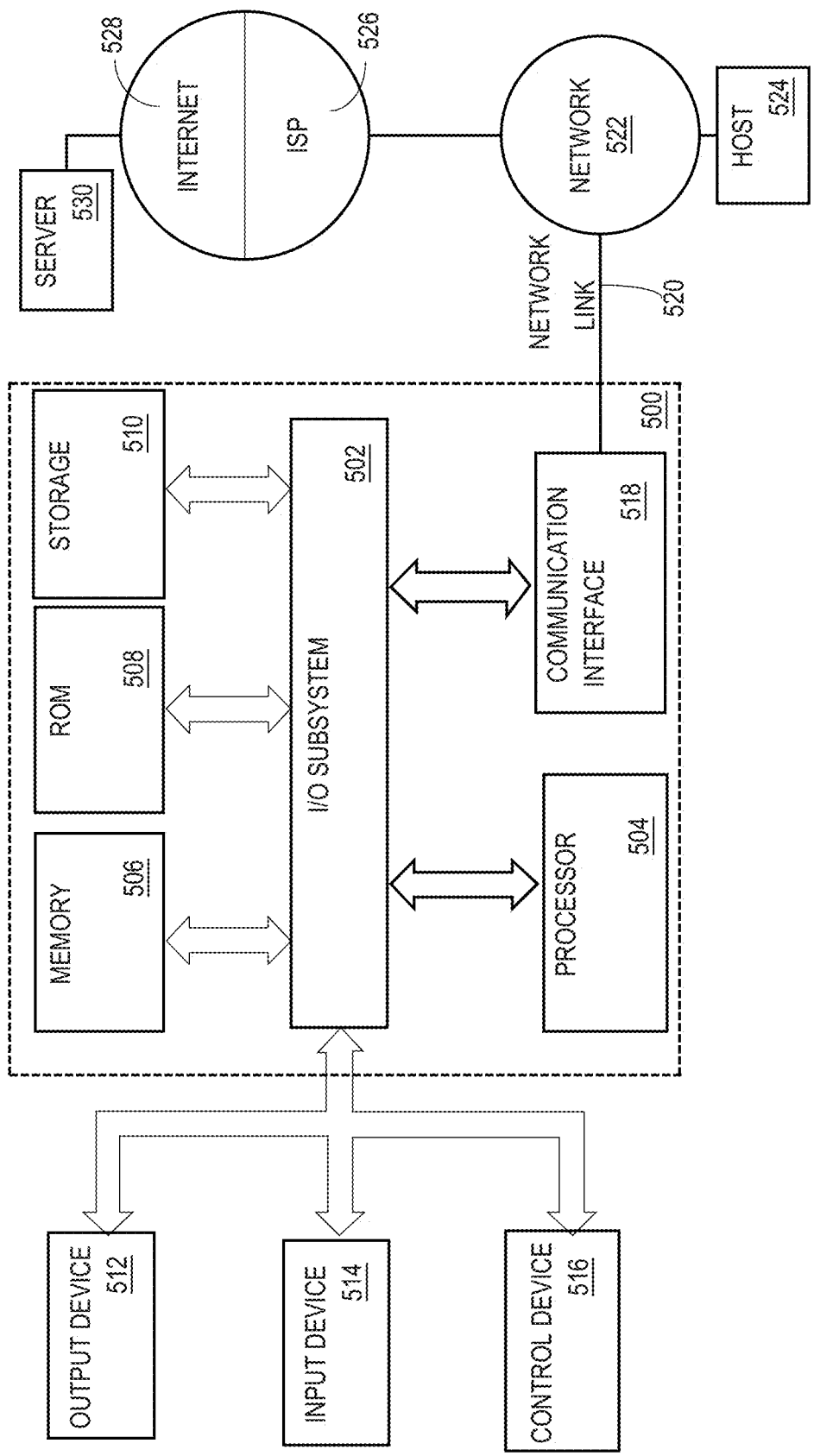
FIG. 5 is a block diagram that illustrates an example computer system with which an embodiment may be implemented.

FIG. 5 is a block diagram that illustrates an example computer system with which an embodiment may be implemented. In the example of FIG. 5, a computer system 500 and instructions for implementing the disclosed technologies in hardware, software, or a combination of hardware and software, are represented schematically, for example as boxes and circles, at the same level of detail that is commonly used by persons of ordinary skill in the art to which this disclosure pertains for communicating about computer architecture and computer systems implementations.

Computer system 500 includes an input/output (I/O) subsystem 502 which may include a bus and/or other communication mechanism(s) for communicating information and/or instructions between the components of the computer system 500 over electronic signal paths. The I/O subsystem 502 may include an I/O controller, a memory controller and at least one I/O port. The electronic signal paths are represented schematically in the drawings, for example as lines, unidirectional arrows, or bidirectional arrows.

At least one hardware processor 504 is coupled to I/O subsystem 502 for processing information and instructions. Hardware processor 504 may include, for example, a general-purpose microprocessor or microcontroller and/or a special-purpose microprocessor such as an embedded system or a graphics processing unit (GPU) or a digital signal processor or ARM processor. Processor 504 may comprise an integrated arithmetic logic unit (ALU) or may be coupled to a separate ALU.

Computer system 500 includes one or more units of memory 506, such as a main memory, which is coupled to I/O subsystem 502 for electronically digitally storing data and instructions to be executed by processor 504. Memory 506 may include volatile memory such as various forms of random-access memory (RAM) or other dynamic storage device. Memory 506 also may be used for storing temporary variables or other intermediate information during execution of instructions to be executed by processor 504. Such instructions, when stored in non-transitory computer-readable storage media accessible to processor 504, can render computer system 500 into a special-purpose machine that is customized to perform the operations specified in the instructions.

Computer system 500 further includes non-volatile memory such as read only memory (ROM) 508 or other static storage device coupled to I/O subsystem 502 for storing information and instructions for processor 504. The ROM 508 may include various forms of programmable ROM (PROM) such as erasable PROM (EPROM) or electrically erasable PROM (EEPROM). A unit of persistent storage 510 may include various forms of non-volatile RAM (NVRAM), such as FLASH memory, or solid-state storage, magnetic disk or optical disk such as CD-ROM or DVD-ROM and may be coupled to I/O subsystem 502 for storing information and instructions. Storage 510 is an example of a non-transitory computer-readable medium that may be used to store instructions and data which when executed by the processor 504 cause performing computer-implemented methods to execute the techniques herein.

The instructions in memory 506, ROM 508 or storage 510 may comprise one or more sets of instructions that are organized as modules, methods, objects, functions, routines, or calls. The instructions may be organized as one or more computer programs, operating system services, or application programs including mobile apps. The instructions may comprise an operating system and/or system software; one or more libraries to support multimedia, programming or other functions; data protocol instructions or stacks to implement TCP/IP, HTTP or other communication protocols; file format processing instructions to parse or render files coded using HTML, XML, JPEG, MPEG or PNG; user interface instructions to render or interpret commands for a graphical user interface (GUI), command-line interface or text user interface; application software such as an office suite, internet access applications, design and manufacturing applications, graphics applications, audio applications, software engineering applications, educational applications, games or miscellaneous applications. The instructions may implement a web server, web application server or web client. The instructions may be organized as a presentation layer, application layer and data storage layer such as a relational database system using structured query language (SQL) or no SQL, an object store, a graph database, a flat file system or other data storage.

Computer system 500 may be coupled via I/O subsystem 502 to at least one output device 512. In one embodiment, output device 512 is a digital computer display. Examples of a display that may be used in various embodiments include a touch screen display or a light-emitting diode (LED) display or a liquid crystal display (LCD) or an e-paper display. Computer system 500 may include other type(s) of output devices 512, alternatively or in addition to a display device. Examples of other output devices 512 include printers, ticket printers, plotters, projectors, sound cards or video cards, speakers, buzzers or piezoelectric devices or other audible devices, lamps or LED or LCD indicators, haptic devices, actuators or servos.

At least one input device 514 is coupled to I/O subsystem 502 for communicating signals, data, command selections or gestures to processor 504. Examples of input devices 514 include touch screens, microphones, still and video digital cameras, alphanumeric and other keys, keypads, keyboards, graphics tablets, image scanners, joysticks, clocks, switches, buttons, dials, slides, and/or various types of sensors such as force sensors, motion sensors, heat sensors, accelerometers, gyroscopes, and inertial measurement unit (IMU) sensors and/or various types of transceivers such as wireless, such as cellular or Wi-Fi, radio frequency (RF) or infrared (IR) transceivers and Global Positioning System (GPS) transceivers.

Another type of input device is a control device 516, which may perform cursor control or other automated control functions such as navigation in a graphical interface on a display screen, alternatively or in addition to input functions. Control device 516 may be a touchpad, a mouse, a trackball, or cursor direction keys for communicating direction information and command selections to processor 504 and for controlling cursor movement on display 512. The input device may have at least two degrees of freedom in two axes, a first axis (e.g., x) and a second axis (e.g., y), that allows the device to specify positions in a plane. Another type of input device is a wired, wireless, or optical control device such as a joystick, wand, console, steering wheel, pedal, gearshift mechanism or other type of control device. An input device 514 may include a combination of multiple different input devices, such as a video camera and a depth sensor.

In another embodiment, computer system 500 may comprise an internet of things (IoT) device in which one or more of the output device 512, input device 514, and control device 516 are omitted. Or, in such an embodiment, the input device 514 may comprise one or more cameras, motion detectors, thermometers, microphones, seismic detectors, other sensors or detectors, measurement devices or encoders and the output device 512 may comprise a special-purpose display such as a single-line LED or LCD display, one or more indicators, a display panel, a meter, a valve, a solenoid, an actuator or a servo.

When computer system 500 is a mobile computing device, input device 514 may comprise a global positioning system (GPS) receiver coupled to a GPS module that is capable of triangulating to a plurality of GPS satellites, determining and generating geo-location or position data such as latitude-longitude values for a geophysical location of the computer system 500. Output device 512 may include hardware, software, firmware and interfaces for generating position reporting packets, notifications, pulse or heartbeat signals, or other recurring data transmissions that specify a position of the computer system 500, alone or in combination with other application-specific data, directed toward host 524 or server 530.

Computer system 500 may implement the techniques described herein using customized hard-wired logic, at least one ASIC or FPGA, firmware and/or program instructions or logic which when loaded and used or executed in combination with the computer system causes or programs the computer system to operate as a special-purpose machine. According to one embodiment, the techniques herein are performed by computer system 500 in response to processor 504 executing at least one sequence of at least one instruction contained in main memory 506. Such instructions may be read into main memory 506 from another storage medium, such as storage 510. Execution of the sequences of instructions contained in main memory 506 causes processor 504 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage 510. Volatile media includes dynamic memory, such as memory 506. Common forms of storage media include, for example, a hard disk, solid state drive, flash drive, magnetic data storage medium, any optical or physical data storage medium, memory chip, or the like.

Storage media is distinct from but may be used in conjunction with transmission media. Transmission media participates in transferring information between storage media. For example, transmission media includes coaxial cables, copper wire and fiber optics, including the wires that comprise a bus of I/O subsystem 502. Transmission media can also take the form of acoustic or light waves, such as those generated during radio-wave and infra-red data communications.

Various forms of media may be involved in carrying at least one sequence of at least one instruction to processor 504 for execution. For example, the instructions may initially be carried on a magnetic disk or solid-state drive of a remote computer. The remote computer can load the instructions into its dynamic memory and send the instructions over a communication link such as a fiber optic or coaxial cable or telephone line using a modem. A modem or router local to computer system 500 can receive the data on the communication link and convert the data to a format that can be read by computer system 500. For instance, a receiver such as a radio frequency antenna or an infrared detector can receive the data carried in a wireless or optical signal and appropriate circuitry can provide the data to I/O subsystem 502 such as place the data on a bus. I/O subsystem 502 carries the data to memory 506, from which processor 504 retrieves and executes the instructions. The instructions received by memory 506 may optionally be stored on storage 510 either before or after execution by processor 504.

Computer system 500 also includes a communication interface 518 coupled to bus 502. Communication interface 518 provides a two-way data communication coupling to network link(s) 520 that are directly or indirectly connected to at least one communication networks, such as a network 522 or a public or private cloud on the Internet. For example, communication interface 518 may be an Ethernet networking interface, integrated-services digital network (ISDN) card, cable modem, satellite modem, or a modem to provide a data communication connection to a corresponding type of communications line, for example an Ethernet cable or a metal cable of any kind or a fiber-optic line or a telephone line. Network 522 broadly represents a local area network (LAN), wide-area network (WAN), campus network, internetwork or any combination thereof. Communication interface 518 may comprise a LAN card to provide a data communication connection to a compatible LAN, or a cellular radiotelephone interface that is wired to send or receive cellular data according to cellular radiotelephone wireless networking standards, or a satellite radio interface that is wired to send or receive digital data according to satellite wireless networking standards. In any such implementation, communication interface 518 sends and receives electrical, electromagnetic or optical signals over signal paths that carry digital data streams representing various types of information.

Network link 520 typically provides electrical, electromagnetic, or optical data communication directly or through at least one network to other data devices, using, for example, satellite, cellular, Wi-Fi, or BLUETOOTH technology. For example, network link 520 may provide a connection through a network 522 to a host computer 524.

Furthermore, network link 520 may provide a connection through network 522 or to other computing devices via internetworking devices and/or computers that are operated by an Internet Service Provider (ISP) 526. ISP 526 provides data communication services through a world-wide packet data communication network represented as internet 528. A server computer 530 may be coupled to internet 528. Server 530 broadly represents any computer, data center, virtual machine or virtual computing instance with or without a hypervisor, or computer executing a containerized program system such as DOCKER or KUBERNETES. Server 530 may represent an electronic digital service that is implemented using more than one computer or instance and that is accessed and used by transmitting web services requests, uniform resource locator (URL) strings with parameters in HTTP payloads, API calls, app services calls, or other service calls. Computer system 500 and server 530 may form elements of a distributed computing system that includes other computers, a processing cluster, server farm or other organization of computers that cooperate to perform tasks or execute applications or services. Server 530 may comprise one or more sets of instructions that are organized as modules, methods, objects, functions, routines, or calls. The instructions may be organized as one or more computer programs, operating system services, or application programs including mobile apps. The instructions may comprise an operating system and/or system software; one or more libraries to support multimedia, programming or other functions; data protocol instructions or stacks to implement TCP/IP, HTTP or other communication protocols; file format processing instructions to parse or render files coded using HTML, XML, JPEG, MPEG or PNG; user interface instructions to render or interpret commands for a graphical user interface (GUI), command-line interface or text user interface; application software such as an office suite, internet access applications, design and manufacturing applications, graphics applications, audio applications, software engineering applications, educational applications, games or miscellaneous applications. Server 530 may comprise a web application server that hosts a presentation layer, application layer and data storage layer such as a relational database system using structured query language (SQL) or no SQL, an object store, a graph database, a flat file system or other data storage.

Computer system 500 can send messages and receive data and instructions, including program code, through the network(s), network link 520 and communication interface 518. In the Internet example, a server 530 might transmit a requested code for an application program through Internet 528, ISP 526, local network 522 and communication interface 518. The received code may be executed by processor 504 as it is received, and/or stored in storage 510, or other non-volatile storage for later execution.

The execution of instructions as described in this section may implement a process in the form of an instance of a computer program that is being executed and consisting of program code and its current activity. Depending on the operating system (OS), a process may be made up of multiple threads of execution that execute instructions concurrently. In this context, a computer program is a passive collection of instructions, while a process may be the actual execution of those instructions. Several processes may be associated with the same program; for example, opening up several instances of the same program often means more than one process is being executed. Multitasking may be implemented to allow multiple processes to share processor 504. While each processor 504 or core of the processor executes a single task at a time, computer system 500 may be programmed to implement multitasking to allow each processor to switch between tasks that are being executed without having to wait for each task to finish. In an embodiment, switches may be performed when tasks perform input/output operations, when a task indicates that it can be switched, or on hardware interrupts. Time-sharing may be implemented to allow fast response for interactive user applications by rapidly performing context switches to provide the appearance of concurrent execution of multiple processes simultaneously. In an embodiment, for security and reliability, an operating system may prevent direct communication between independent processes, providing strictly mediated and controlled inter-process communication functionality.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method providing an improvement in speed and efficiency of configuring a digital electronic integrated circuit (IC) that supports partial reconfiguration, a particular IC having a plurality of reconfigurable partitions and a plurality of primitive variations configurable in each of the reconfigurable partitions, the method comprising:
    before writing configuration bitstreams to the particular IC, compiling and storing, using digital storage, a plurality of primitive bitstreams for a plurality of different primitive functions that can be written to and implemented on the particular IC;
    receiving input to specify functional logic of an algorithm to implement on the particular IC using reconfigurable logic;
    automatically determining a subset of the primitive functions comprising particular primitive functions that correspond to the functional logic;
    obtaining, from the digital storage, a subset of the primitive bitstreams that corresponds to the subset of the primitive functions;
    using one or more partial reconfiguration operations, writing the subset of the primitive bitstreams to the particular IC;
    wherein the method is performed by one or more computing devices.

2. The method of claim 1, the particular IC comprising a field programmable gate array (FPGA) having M reconfigurable partitions and N variations in each of the reconfigurable partitions, the method further comprising compiling and storing the plurality of primitive bitstreams for a plurality of different primitive functions that can be written to and implemented on all combinations of M and N on the FPGA, resulting in storing M*N primitives.

3. The method of claim 1, further comprising:
    performing the compiling and storing using a server that is communicatively coupled to a client computer system;
    transmitting, from the client computer system to the server, a request to provide the subset of the primitive bitstreams that corresponds to the subset of the primitive functions;
    transmitting, from the server to the client computer system, a response that includes the subset of the primitive bitstreams that corresponds to the subset of the primitive functions.

4. The method of claim 3, wherein automatically determining a subset of the primitive functions comprising particular primitive functions that correspond to the functional logic further comprises determining particular partitions and variations for each of the primitive functions, and storing metadata identifying the particular partitions and variations, and wherein transmitting the request further comprises transmitting the metadata with the request.

5. The method of claim 1, adapted for use with an FPGA comprising a plurality of rows each having a plurality of sequentially connected DSP block partial reconfiguration regions, a plurality of interconnects to allow arbitrary connections between rows, each of the DSP block partial reconfiguration regions being configurable as one of N variants using a different bitstream primitive from among the primitive bitstreams, each of the variants having one or more inputs, one or more outputs and being connected to a configuration AXI bus.

6. The method of claim 5, adapted for use with the FPGA in which each of the variants comprises logic for a different purpose and has as output multiplexing to select which signals are passed to two or more outputs.

7. The method of claim 1, adapted for use with an FPGA comprising a plurality of rows each having a plurality of sequentially connected DSP block partial reconfiguration regions, a plurality of interconnects to allow arbitrary connections between rows, each of the DSP block partial reconfiguration regions being configurable as one of N variants using a different bitstream primitive from among the primitive bitstreams, each of the variants having two or more inputs, two or more outputs and being connected to a configuration AXI bus;
    wherein a first set of one or more of the DSP block partial reconfiguration regions are larger PR regions that can be configured as single-channel versions of instruments;

wherein a second set of one or more of the DSP block partial reconfiguration regions are adapted to implement low-level functions.

8. The method of claim 1, adapted for use with an FPGA comprising a plurality of rows each having a plurality of sequentially connected DSP block partial reconfiguration regions, a plurality of interconnects to allow arbitrary connections between rows, each of the DSP block partial reconfiguration regions being configurable as one of N variants using a different bitstream primitive from among the primitive bitstreams, each of the variants having two or more inputs, two or more outputs and being connected to a configuration AXI bus;

wherein a first set of one or more of the DSP block partial reconfiguration regions are larger PR regions that are configured for signal generation or controller instruments;

wherein a second set of one or more of the DSP block partial reconfiguration regions are configured for measurement or monitoring instruments.

9. The method of claim 1, further comprising receiving input in a graphical user interface to select and connect graphical blocks representing the functional logic of the algorithm to implement on the particular IC, the graphical blocks relating to reconfigurable logic.

10. One or more non-transitory computer-readable storage media storing sequences of instructions providing an improvement in speed and efficiency of configuring a digital electronic integrated circuit (IC) that supports partial reconfiguration, a particular IC having a plurality of reconfigurable partitions and a plurality of primitive variations configurable in each of the reconfigurable partitions, and which when executed using one or more processors cause the one or more processors to perform:

before writing configuration bitstreams to the particular IC, compiling and storing, using digital storage, a plurality of primitive bitstreams for a plurality of different primitive functions that can be written to and implemented on the particular IC;

receiving input to specify functional logic of an algorithm to implement on the particular IC using reconfigurable logic;

automatically determining a subset of the primitive functions comprising particular primitive functions that correspond to the functional logic;

obtaining, from the digital storage, a subset of the primitive bitstreams that corresponds to the subset of the primitive functions;

using one or more partial reconfiguration operations, writing the subset of the primitive bitstreams to the particular IC.

11. The computer-readable media of claim 10, the particular IC comprising a field programmable gate array (FPGA) having M reconfigurable partitions and N variations in each of the reconfigurable partitions, further comprising sequences of instructions which when executed cause compiling and storing the plurality of primitive bitstreams for a plurality of different primitive functions that can be written to and implemented on all combinations of M and N on the FPGA, resulting in storing M*N primitives.

12. The computer-readable media of claim 10, further comprising sequences of instructions which when executed cause:

performing the compiling and storing using a server that is communicatively coupled to a client computer system;

transmitting, from the client computer system to the server, a request to provide the subset of the primitive bitstreams that corresponds to the subset of the primitive functions;

transmitting, from the server to the client computer system, a response that includes the subset of the primitive bitstreams that corresponds to the subset of the primitive functions.

13. The computer-readable media of claim 12, wherein automatically determining a subset of the primitive functions comprising particular primitive functions that correspond to the functional logic further comprises sequences of instructions which when executed cause determining particular partitions and variations for each of the primitive functions, and storing metadata identifying the particular partitions and variations, and wherein transmitting the request further comprises transmitting the metadata with the request.

14. The computer-readable media of claim 10, adapted for use with an FPGA comprising a plurality of rows each having a plurality of identical sequentially connected DSP block partial reconfiguration regions, a plurality of interconnects to allow arbitrary connections between rows, each of the DSP block partial reconfiguration regions being configurable as one of N variants using a different bitstream primitive from among the primitive bitstreams, each of the variants having one or more inputs, one or more outputs and being connected to a configuration AXI bus.

15. The computer-readable media of claim 14, adapted for use with the FPGA in which each of the variants comprises logic for a different purpose and has as output multiplexing to select which signals are passed to two or more outputs.

16. The computer-readable media of claim 10, adapted for use with an FPGA comprising a plurality of rows each having a plurality of sequentially connected DSP block partial reconfiguration regions, a plurality of interconnects to allow arbitrary connections between rows, each of the DSP block partial reconfiguration regions being configurable as one of N variants using a different bitstream primitive from among the primitive bitstreams, each of the variants having two or more inputs, two or more outputs and being connected to a configuration AXI bus;

wherein a first set of one or more of the DSP block partial reconfiguration regions are larger PR regions that can be configured as single-channel versions of instruments;

wherein a second set of one or more of the DSP block partial reconfiguration regions are adapted to implement low-level functions.

17. The computer-readable media of claim 10, adapted for use with an FPGA comprising a plurality of rows each having a plurality of sequentially connected DSP block partial reconfiguration regions, a plurality of interconnects to allow arbitrary connections between rows, each of the DSP block partial reconfiguration regions being configurable as one of N variants using a different bitstream primitive from among the primitive bitstreams, each of the variants having two or more inputs, two or more outputs and being connected to a configuration AXI bus;

wherein a first set of one or more of the DSP block partial reconfiguration regions are larger PR regions that are configured for signal generation or controller instruments;

wherein a second set of one or more of the DSP block partial reconfiguration regions are configured for measurement or monitoring instruments.

18. The computer-readable media of claim 10, further comprising sequences of instructions which when executed cause receiving input in a graphical user interface to select and connect graphical blocks representing functional logic of an algorithm to implement on the particular IC, the graphical blocks relating to reconfigurable logic.

\* \* \* \* \*